United States Patent [19]
Chan

[11] B 3,995,260
[45] Nov. 30, 1976

[54] MNOS CHARGE TRANSFER DEVICE MEMORY WITH OFFSET STORAGE LOCATIONS AND RATCHET STRUCTURE

[75] Inventor: Yum T. Chan, Newport Beach, Calif.

[73] Assignee: Rockwell International Corporation, El Segundo, Calif.

[22] Filed: Jan. 31, 1975

[21] Appl. No.: 545,945

[44] Published under the second Trial Voluntary Protest Program on January 27, 1976 as document No. B 545,945.

[52] U.S. Cl. .................... 340/173 R; 340/173 CA; 357/24; 357/54
[51] Int. Cl.[2] ................. G11C 11/40; G11C 11/24; G11C 19/28
[58] Field of Search.... 340/173 R, 173 CA, 173 SP; 357/24, 54; 307/238, 304

[56] References Cited
UNITED STATES PATENTS 3,654,499 4/1972 Smith ........................... 340/173 CA
3,863,065 1/1975 Kosonocky et al. ................. 357/24

*Primary Examiner*—Stuart N. Hecker
*Attorney, Agent, or Firm*—H. Fredrick Hamann; G. Donald Weber, Jr.; Robert Ochis

[57] ABSTRACT

A MNOS charge transfer device memory having permanent storage locations displaced laterally from the charge transfer channel is disclosed. The device structure controls charge spreading to prevent charge-to-be-transferred from reaching the portion of the charge transfer material underlying the permanent storage locations. Charges from the charge transfer channel are enabled to enter the charge transfer material underlying the permanent storage locations only when information is to be written into the permanent storage locations or read from the permanent storage locations.

9 Claims, 12 Drawing Figures

MNOS CHARGE TRANSFER DEVICE MEMORY WITH OFFSET STORAGE LOCATIONS AND RATCHET STRUCTURE

The invention herein described was made in the course of or under a contract or subcontract thereunder with the Department of the Navy.

BACKGROUND OF THE INVENTION

1. Field of the Invention

This invention relates to the field of charge transfer device memories having permanent non-volatile storage capabilities.

2. Description of Prior Art

Charge transfer device memories utilizing MNOS storage are known in the prior art. These memories are of two types, a first type provides permanent storage locations over the charge transfer channel and a second type provides permanent storage locations which are displaced laterally from the charge transfer channel. Memories of the first type are simpler to operate than those of the second type, but are less efficient because of an excessive number of fast states at the surface of the charge transfer channel. The excessive fast states result from the overlying nitride layer which prevents the excessive fast states from being annealed out. Memories of the second type provide more efficient charge transfer action than memories of the first type. The more efficient charge transfer action results from annealing of the charge transfer channel, is effective in memories of the second type because their nitride layer does not overlie the propagation portion of the channel.

The operation of the second type memory is more complicated than that of the first type memory because an electrode and a control voltage must be provided to control cummunication between the propagation portion of the charge transfer channel and portion of the charge transfer medium underlying the permanent storage locations in order to prevent a loss of transfer efficiency during charge transfer as a result of undesired spreading of charge into the portion of the charge transfer medium underlying the permanent storage sites.

SUMMARY OF THE INVENTION

The invention comprises an MNOS charge transfer device memory in which the MNOS permanent storage locations are displaced laterally from the charge transfer channel along which charges are transported through the charge transfer medium. The physical structure of this memory prevents charge from spreading from the transfer channel into the portion of the charge transfer medium underlying the MNOS memory structure, except when it is desired to write information or read information from the MNOS structure. A ratchet structure is employed in order to control transfer of charge between the transfer channel and the portion of the charge transfer medium underlying the MNOS structure. During forward propagation in the main charge transfer channel, the device structure prevents spreading the charge into the region underlying the MNOS structure through the imposition of unfavorable potential conditions for that movement. However, if it is attempted to move charge in a backward direction along the main charge transfer channel, the structure forces the charge to shift sidewise into the region of the structure underlying the MNOS memory structure through imposition of potentials which favor that movement over continued backward movement.

DETAILED DESCRIPTION OF THE PREFERRED EMBODIMENT

Figure 1:
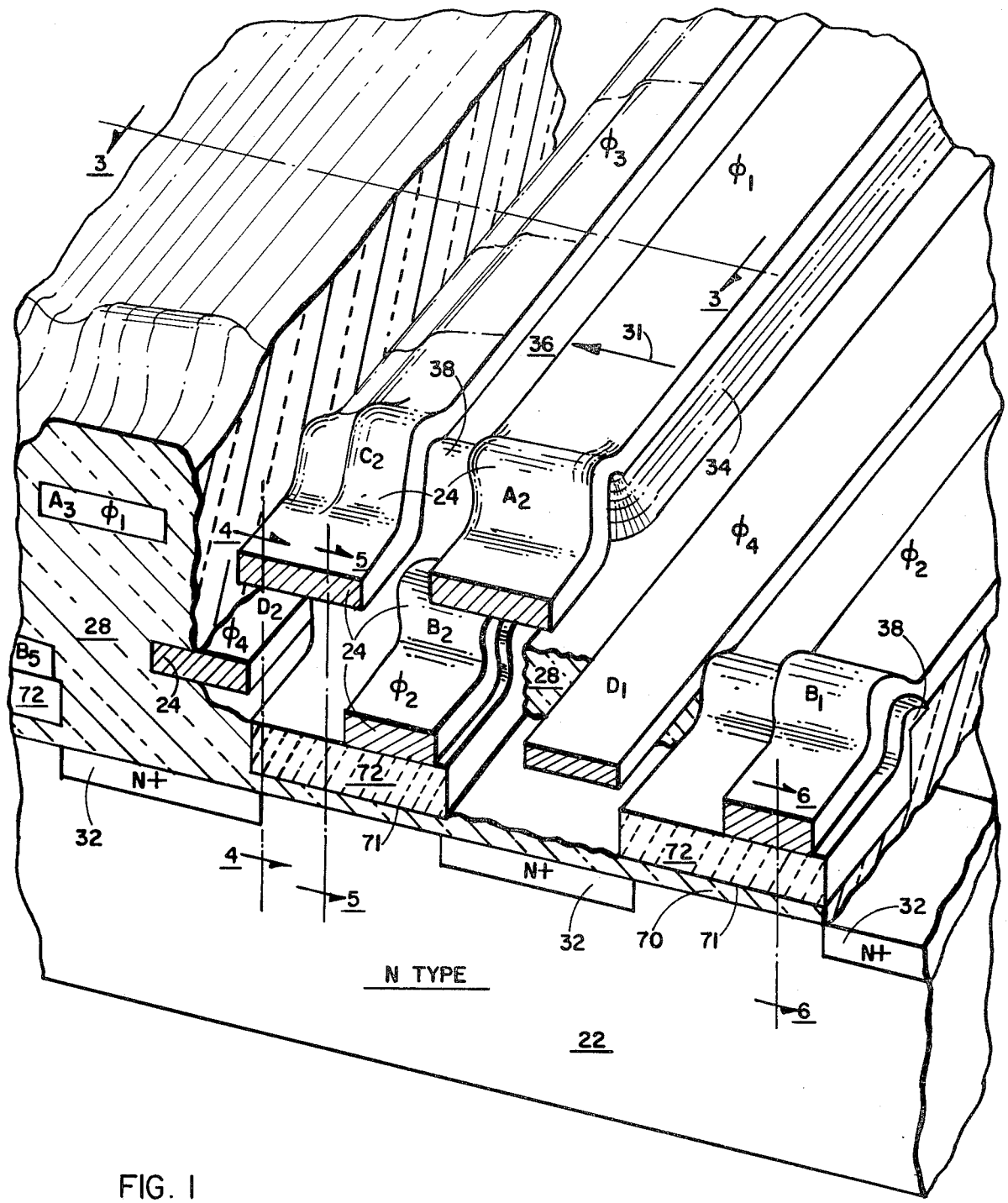
FIG. 1 is a partially cut-away perspective view of a memory in accordance with the invention.

A preferred embodiment 20 of a permanent storage charge transfer memory device in accordance with the present invention is illustrated in a partially cut-away perspective view in FIG. 1.

Figure 2:
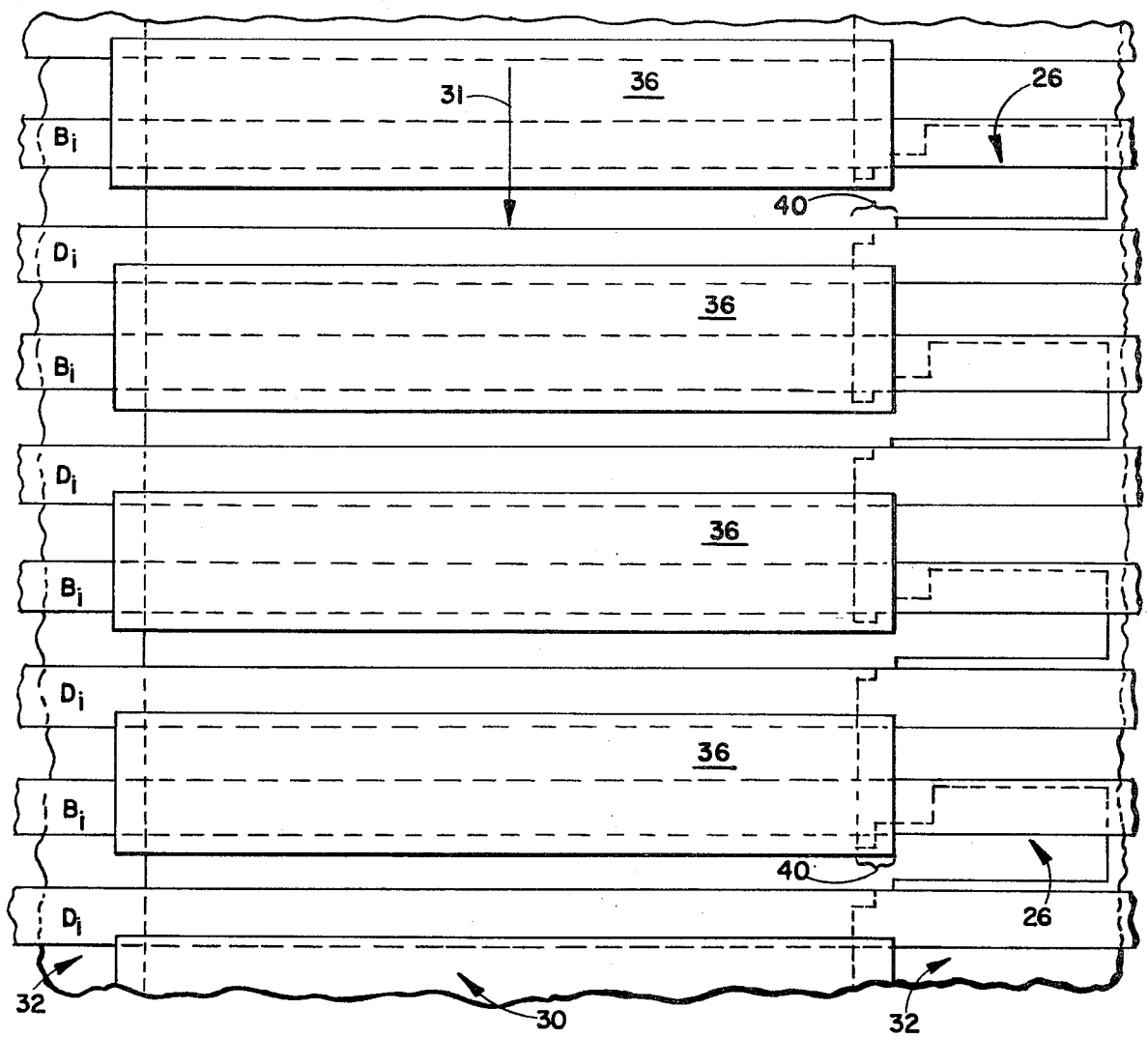
FIG. 2 is a plan view of the device of FIG. 1 with the upper layer of electrodes removed.

The memory device 20 of FIG. 1 comprises a material 22 capable of supporting charge transfer action, an overlying set of charge transfer control electrodes 24, a set 26 of overlying permanent charge storage structures capable of permanently trapping charge and electrical insulating material 28 which spaces the electrodes 24 from charge transfer material 22. Memory device 20 is illustrated in plane view in FIG. 2, where the upper set of electrodes have been deleted from the diagram in order to maintain the clarity of the diagram.

The charge transfer material 22, which may preferably be silicon (N-type silicon is illustrated), has at least one charge transfer channel 30 defined therein. As illustrated in the plane view of FIG. 2, channel 30 may preferably be defined by a surrounding channel stop or inversion stop region 32 which may comprise heavily doped silicon when charge transfer material 22 is silicon. The inversion stop region 32 prevents the overlying electrode set 24 from causing inversion in the charge transfer material 22 under the inversion stop region. The prevention of inversion under the region 32 restricts the charge transfer channel from extending into the inversion stop region 32.

The charge transfer electrode set 24 preferably comprises a four phase drive electrode system. In the figures, the phase 1 ($\phi_1$) electrodes are designated $A_i$ where the subscript $i$ varies from 1 to $n$ where $n$ is the number of periods of the electrode system overlying the charge transfer channel. Similarly, the phase two ($\phi_2$) electrodes are designated $B_i$, the phase three ($\phi_3$)

electrodes are designated $C_i$ and the phase four ($\phi_4$) electrodes are designated $D_i$.

Each permanent charge storage structure 26 preferably comprises an MNOS structure. A thin layer preferably about 20–25A thick and preferably of silicon oxide is formed on the surface of the silicon charge transfer material within the area where the permanent storage structure is desired. A relatively thick layer 72 of preferably silicon nitride is deposited on the silicon oxide layer. In the illustrated preferred embodiment layer 72 is preferably about 2600A thick. The $\phi_2$ electrode $B_i$ is preferably deposited directly on the silicon nitride layer 72 to enable control of the potential thereunder. An interface 71 between layers 70 and 72 serves as a permanent charge storage site. The charge stored at the interface 71 is increased or decreased by tunneling of charge between the interface 71 and the underlying charge transfer material 22. Tunneling is selectively controlled by the voltage applied to the electrode $C_i$ overlying charge storage interface 71 and by the charge present in a potential well 62 underlying the charge storage structure within charge transfer material 22.

As part of the process of depositing the silicon nitride layer 72, a ridge 38 is intentionally formed in the insulating material overlying the portion of the charge transfer material which will form the transition region 40 through which charge may propagate between the channel and the charge transfer material underlying the permanent storage structure. This ridge serves to reduce the depth of a potential well which an overlying electrode induces thereunder within the transition region 40 in order to create a barrier to charge transport between the charge transfer channel and the charge transfer material underlying the permanent storage structure 26.

Figure 3:
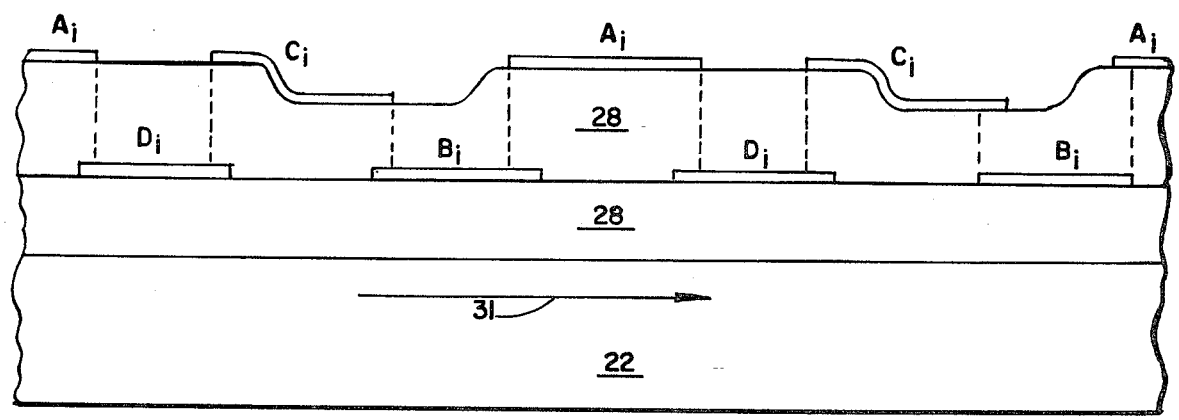
FIG. 3 is a cross-section through the device of FIG. 1 taken along line A—A looking in the direction of the arrows.

The portion of each permanent storage structure 26 at which permanent storage occurs in memory device 20 underlies a permanent storage portion of the corresponding phase two ($B_i$) electrode. As illustrated in the plan view of FIG. 2, the permanent storage structures 26 are displaced laterally from the charge transfer channel. The $\phi_3$ electrodes $C_i$ are disposed across a step 34 in the thickness of the underlying insulating material 28. The "riser" of this step is disposed substantially perpendicular to the direction of charge transfer within the charge transfer channel. This creates a preferential direction of charge transfer within the charge transfer channel 30 in the direction of arrow 31 (FIGS. 1, 3). That is, in a direction in which charge flows successively from under a $\phi_1$ electrode $A_i$ to under an adjacent $\phi_2$ electrode $B_i$ thence to under an adjacent $\phi_3$ electrode $C_i$, thence to under an adjacent $\phi_4$ electrode $D_i$ and then to under the adjacent $\phi_1$ electrode $A_i$. This preferential direction of flow is a result of the fact that with a given potential applied to electrode C, the portion of the $\phi_3$ electrode C which is lowest or nearest to the underlying charge transfer material 22 creates a deeper potential well than does the portion of the electrode C which is highest or furtherest from the underlying charge transfer material 22. Consequently, whenever there is a small quantity of charge under a $\phi_3$ electrode C, the charge localizes in the deepest part of the well — under the nearer portion of electrode C. During charge transfer operation there is always a small quantity of charge in a potential well toward the end of the process of transferring charges from under one electrode to under the succeeding electrode. Therefore, when charge is transferred in the preferential direction substantially all of the charge will be transferred, but if charge were transferred in the opposite direction a substantial quantity of charge would be lost each time charge was transferred from beneath an electrode C, since there is a potential barrier which will prevent transfer of the quantity of charge required to fill the deep part of the potential well under electrode C to the level of the shallow potential well under electrode C.

Because of the preferential direction of charge transfer, the portion of the $\phi_3$ electrode C which is spaced furtherest from the underlying charge transfer material will sometimes be referred to hereinafter as the "upstream" portion or side of electrode C, independent of the actual direction of charge motion. Because of its relative spacing from charge transfer material 22, the upstream portion of electrode C will also be referred to as the "upper" portion of electrode C. Similarly, the portion of electrode C which is nearest to the underlying charge transfer material will be referred to as the "lower" or "downstream" portion of electrode C.

It is preferred that the electrodes A be disposed at the same distance from the underlying charge transfer material 22 as the upstream portion of the electrodes $C_i$, therefore, the electrodes $A_i$ are preferably disposed on the thickened portion 36 of the insulation 28 to assure uniformity of the spacing of electrodes $A_i$ and the upper portions of the electrodes $C_i$ from the underlying charge transfer material 22. Such a relationship between the spacing of the electrodes $A_i$ and $C_i$ simplifies the operation of the memory device in a manner which will be explained hereinafter.

Figure 4:
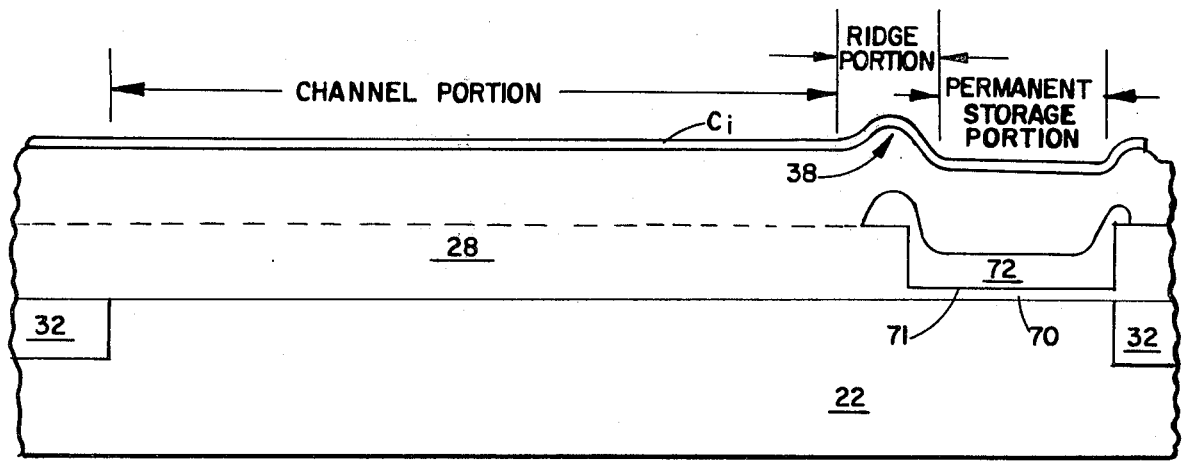
FIG. 4 is a cross-section taken through the device of FIG. 1 along the line B—B looking in the direction of the arrows.
Figure 5:
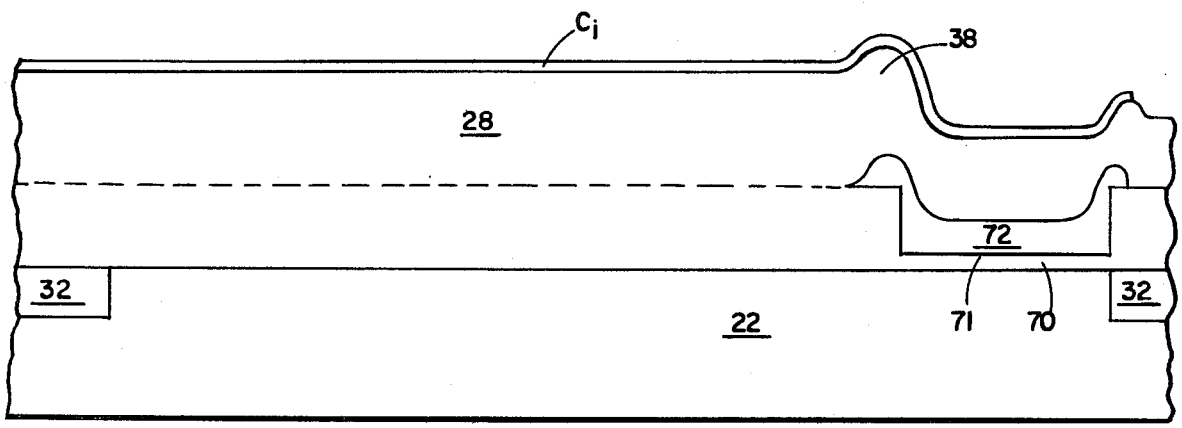
FIG. 5 is a cross-section through the device of FIG. 1 taken along the lines C—C looking in the direction of the arrows.
Figure 6:
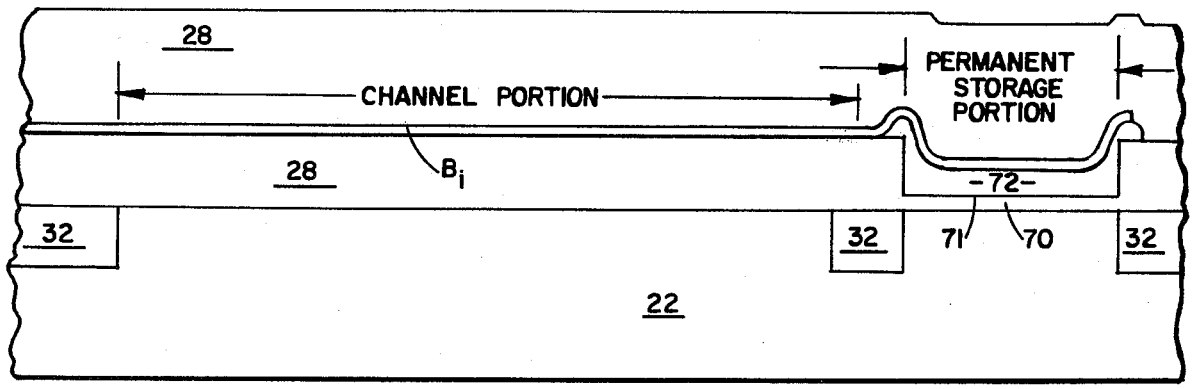
FIG. 6 is a cross-section through the device of FIG. 1 taken along the line D—D looking in the direction of the arrows.

The thickened or elevated portion 36 of the insulation 28 does not extend over the permanent charge storage structures 26 which are laterally displaced from the charge transfer channel 30. As can be seen in FIG. 4 which is a cross-section through memory device 20 taken along the line 4—4 in FIG. 1, i.e., through the downstream portion of an electrode C, a channel portion of the downstream portion of an electrode $C_i$ extends over the main charge transfer channel at a constant spacing of about 3,500A from the underlying charge transfer material 22. A permanent storage portion of an electrode $C_i$ extends over the main charge transfer channel at a constant spacing of about 2,600A from the underlying charge transfer material 22 than is the downstream channel portion of the electrode $C_i$. At the transition for the main charge transfer channel to the permanent charge storage structure 26, a ridge 38 in insulator 28 overlies each region 40 which interconnects the charge transfer channel 30 and each portion of the charge transfer medium 22 underlying a permanent storage structures 26. This ridge 28 spaces ridge portions of an electrode C further from the underlying charge transfer material 22 than the corresponding portion of the channel portion of the electrode $C_i$. As can be seen from FIG. 5 which is a cross-section of memory device 20 taken along the line 5—5 of FIG. 1, i.e. through the upstream portion of an electrode C, a channel portion of the upstream portion of an electrode $C_i$ extends across the charge transfer channel at a constant spacing of about 4,500A from the underlying charge transfer material 22. This spacing is substantially greater than the spacing of downstream channel portion of the electrode $C_i$ from the charge transfer material 22. As was the case with the lower portion of the electrode $C_i$, the ridge 38 causes the upper portion of the electrode $C_i$ to be spaced a greater distance from the underlying charge transfer material 22 in the vicinity of the transition region 40 from the main charge transfer channel 30 to the permanent storage structure 26. It will be observed, that despite the fact that the spacing of the upstream channel portion of electrode C from the underlying material 22 is greater than the spacing of the downstream channel portion of electrode C from the underlying material 22, the upstream and downstream permanent storage portions of electrode C are spaced the same distance from the underlying charge transfer material, the difference in spacing between the upper and lower channel portions of each electrode $C_i$ from the main charge transfer channel together with the increase in that spacing provided by the ridge 38 comprise the directional control of the ratchet feature of this invention.

In particular, it will be noted, that the ridge 38 spaces the downstream ridge portion of the electrode $C_i$ at a lesser distance from the underlying charge transfer material 22 than the distance by which the upstream channel portion of electrode $C_i$ is spaced from charge transfer material 22. Ridge 38 extends in a direction parallel to the direction of charge propagation in charge transfer channel 30 across transition region 40. In this way, spreading of charge into the region 40 during propagation of charge in a forward direction along the main charge transfer channel 30 is prevented because at each point along the channel, the potential well within the main transfer channel 30 is deeper than the potential well under the ridge 38. Thus, spreading of charge from under electrodes $C_i$ into transition region 40 is prevented by the ridges 38. Similarly, upstream and downstream from the transition region 40 spreading of the charge toward the permanent charge storage structures 26 is prevented by inversion stop region 32, i.e., spreading of charge from under the electrodes $A_i$, $B_i$ and $D_i$ is prevented by the inversion stop region 32. This technique is successful so long as the potential under the channel portion of electrode $C_i$ is low enough to assure that the quantity of charge being transported beneath electrode $C_i$ does not raise the potential within the charge transfer channel above the level in the transition region 40 under the ridge portion of electrode $C_i$. It will be understood, that although in the preferred embodiment a nitride deposit is utilized to form the ridges 38, an oxide or other material may be utilized to form ridges 38. Although, in the preferred embodiment of this invention, the upper portion of the electrode $C_i$ is spaced at a greater distance from the underlying charge transfer material than that portion of the lower portion of the electrode $C_i$ which overlies ridge 38, it will be understood that the limiting requirement is not on the spacing of the electrodes from the underlying material, but rather, that when the electrode C has a propagation potential applied thereto, (1) the portion of the resulting potential well underlying the ridge portion of the lower portion electrode $C_i$ (well 57) is deeper than the portion of the potential well underlying the upper portion of electrode $C_i$ (well 54); (2) the potential well 56 under the channel portion of the lower portion of the electrode $C_i$ is deeper than the potential well 57 under the ridge portion of the lower portion $C_i$ and (3) the potential well underlying the ridge portion of the lower portion of the electrode $C_i$ is deeper than the potential well 54 underlying the channel portion of the upper portion of electrode $C_i$.

Differently phrased, the requirement is that (1) when charge is being propagated in the "forward" direction the shallower portion of the potential well underlying the ridge 38 will constrain charge to remain within the main charge transfer channel, and (2) when charge is propagated in the "backward" direction the shallow potential well under the upper portion of electrode $C_i$ will constrain charge to flow over the less shallow potential well underlying the ridge portion of the lower portion of the electrode $C_i$, whereby the charge will be diverted sidewise into transition region 40 of the charge transfer medium 22 and thus under the permanent storage structure 26. This may be achieved by any desired technique, include use of materials of different dielectric constants to obtain the shallower potential well, rather than a ridge in the insulator.

Figure 7:
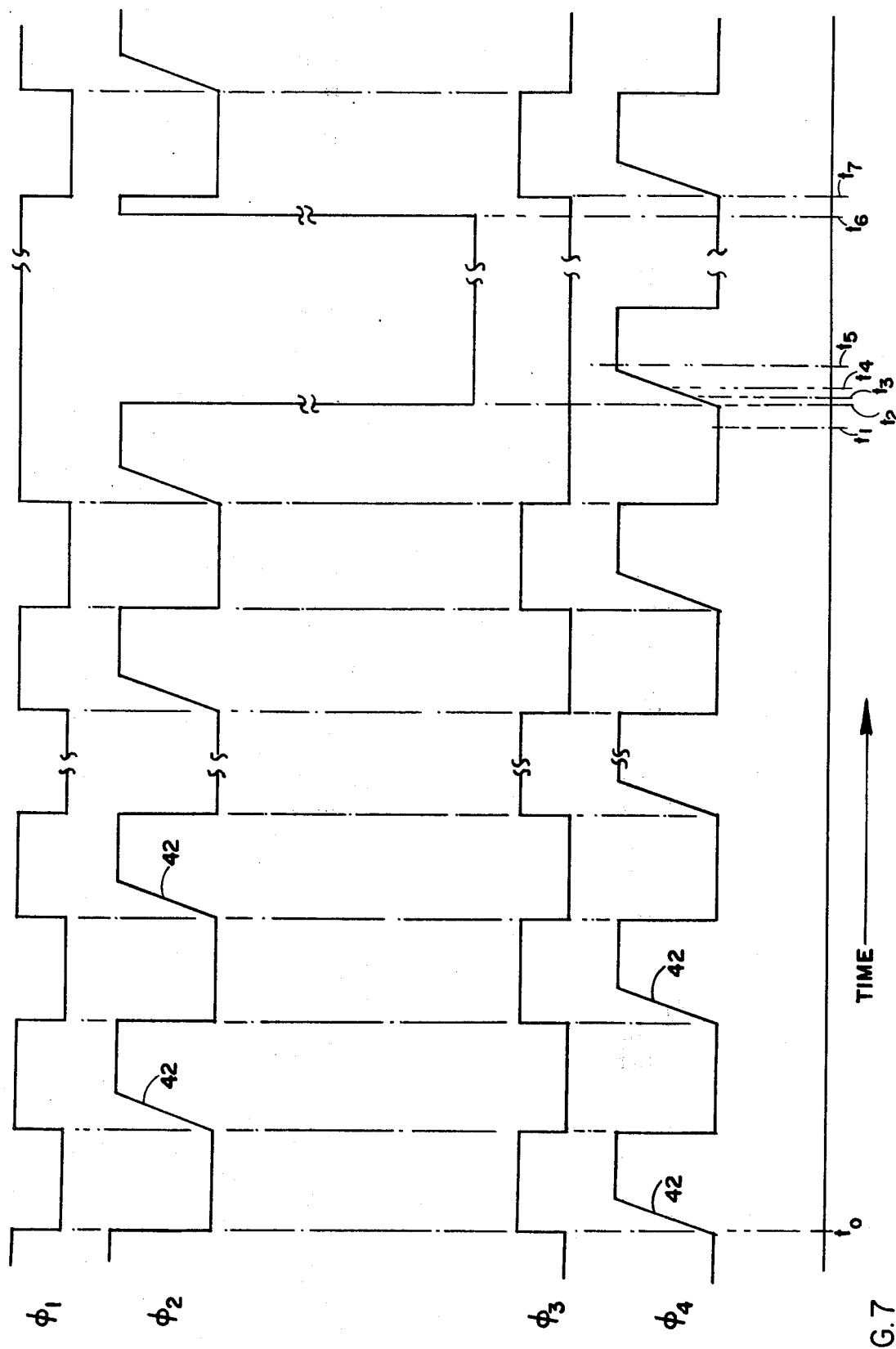
FIG. 7 is a diagram of the control voltages utilized in propagating charge along the channel, in a forward direction, backing charge sidewise under the permanent storage structures and in permanently storing charge in the permanent storage structures.
Figure 8:
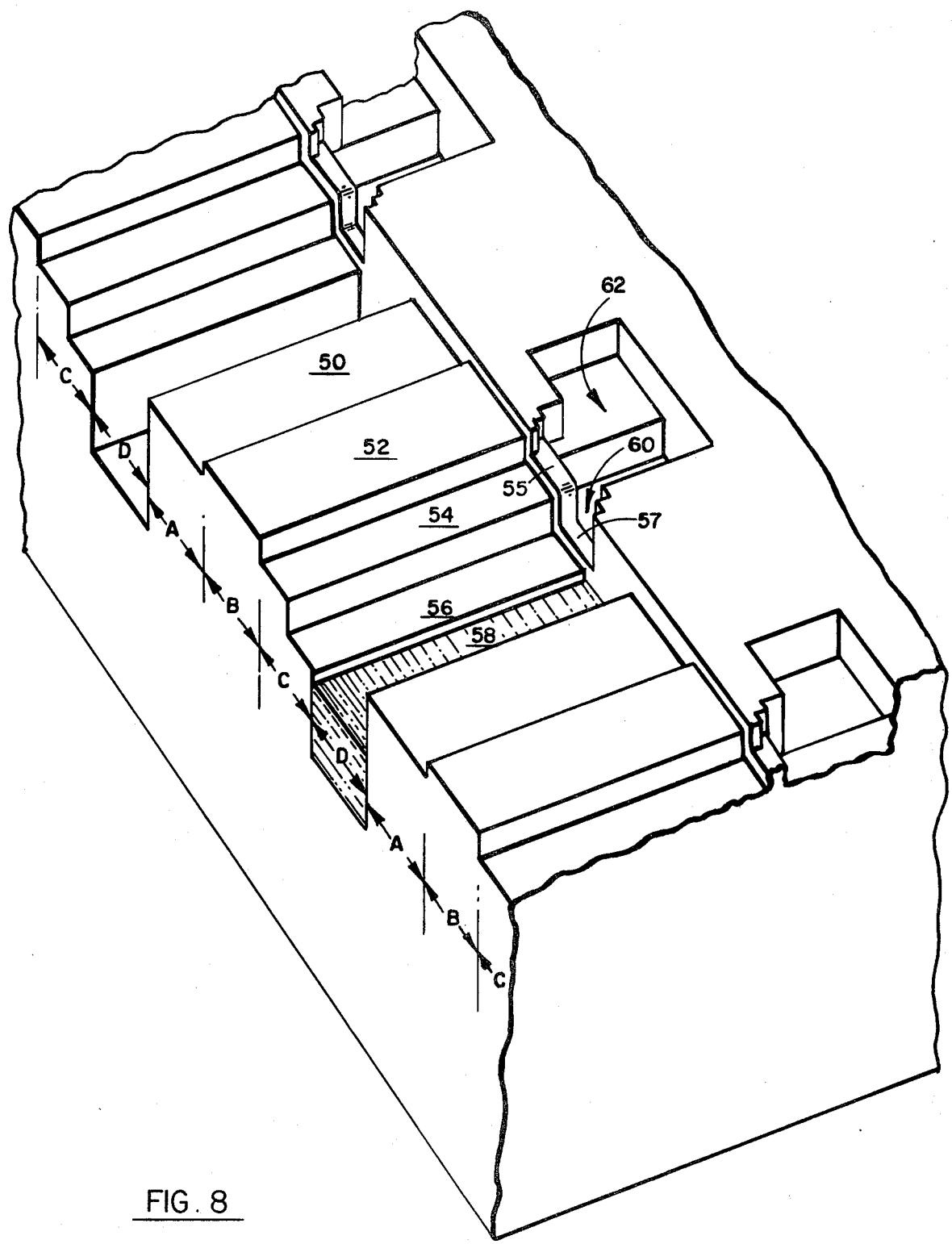
FIGS. 8–12 are perspective cut-away views of the potential well pattern which is utilized to move charge from the main charge transfer channel to the portion of the charge transfer medium underlying the MNOS storage structure.
Figure 9:
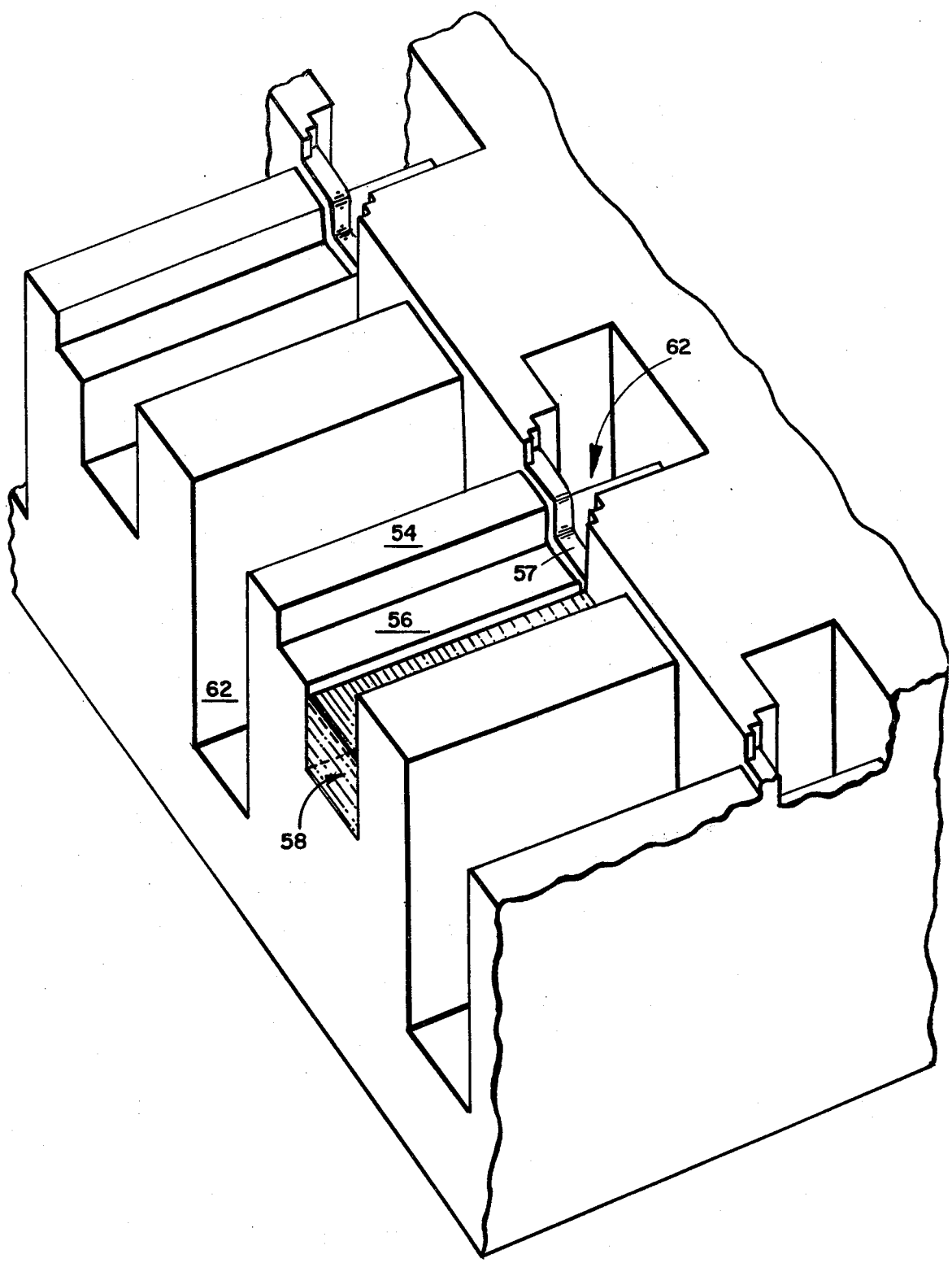

In order to propagate charge in transfer channel 30 in the forward direction, the waveforms illustrated in FIG. 7 between $t_0$ and $t_1$ are applied to the drive electrodes. The $\phi_1$ waveform is applied to the phase one electrodes $A_i$, the $\phi_2$ waveform is applied to the phase two electrodes $B_i$, the $\phi_3$ waveform is applied to the phase 3 electrodes $C_i$ and the $\phi_4$ waveform is applied to the phase 4 electrodes $D_i$. The positive slope portions 42 of the $\phi_2$ and $\phi_4$ waveforms are provided in order to allow the charge within a packet stored under a corresponding electrode to be slowly boosted to a level where transport under one of the transfer gates becomes favorable. This enables the charge to travel to the next deep potential well without a substantial loss of charge, as would occur due to recombination if the voltage applied to the $\phi_2$ or $\phi_4$ electrode were abruptly changed to reduce the depth of the potential well.

Figure 10:
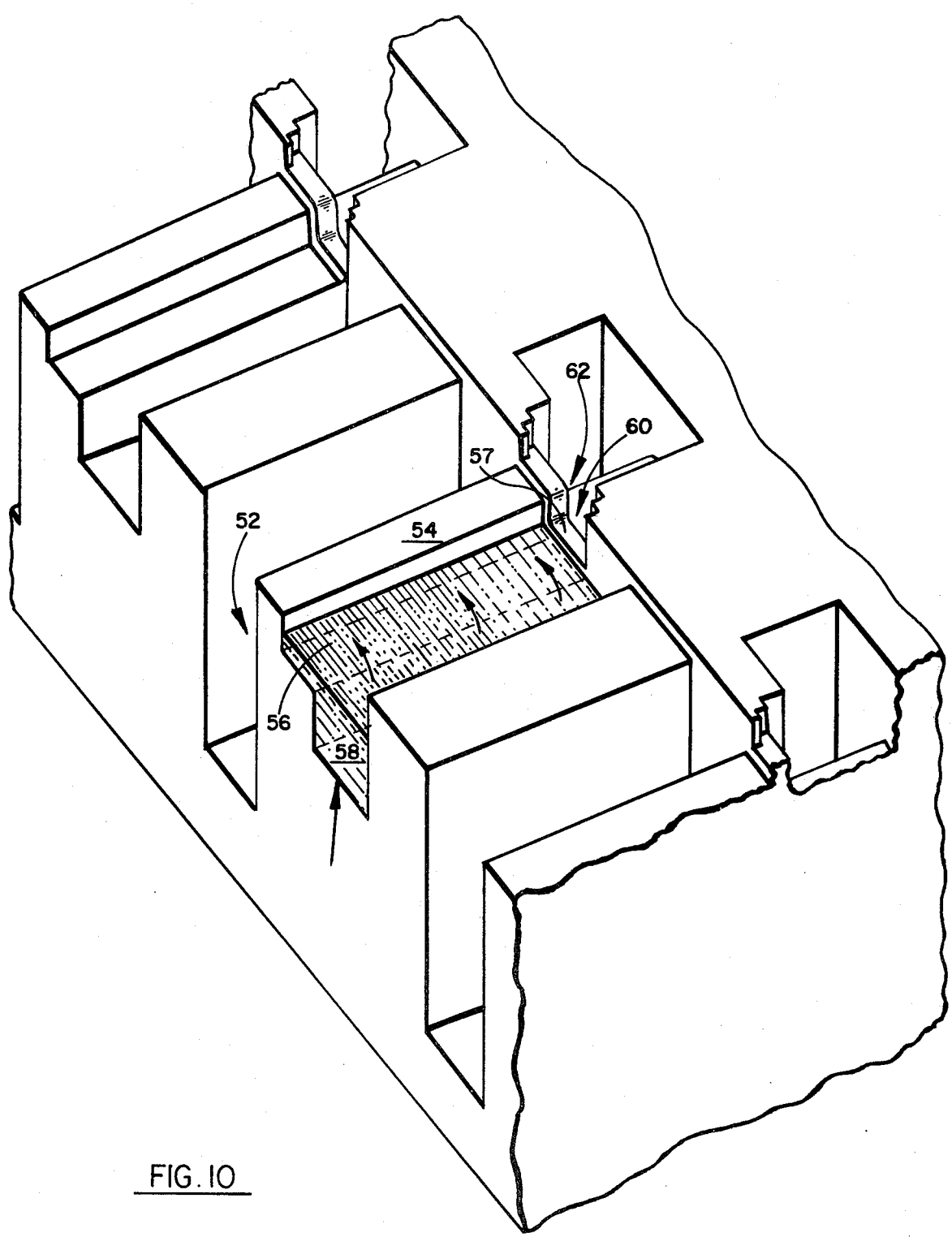
Figure 11:
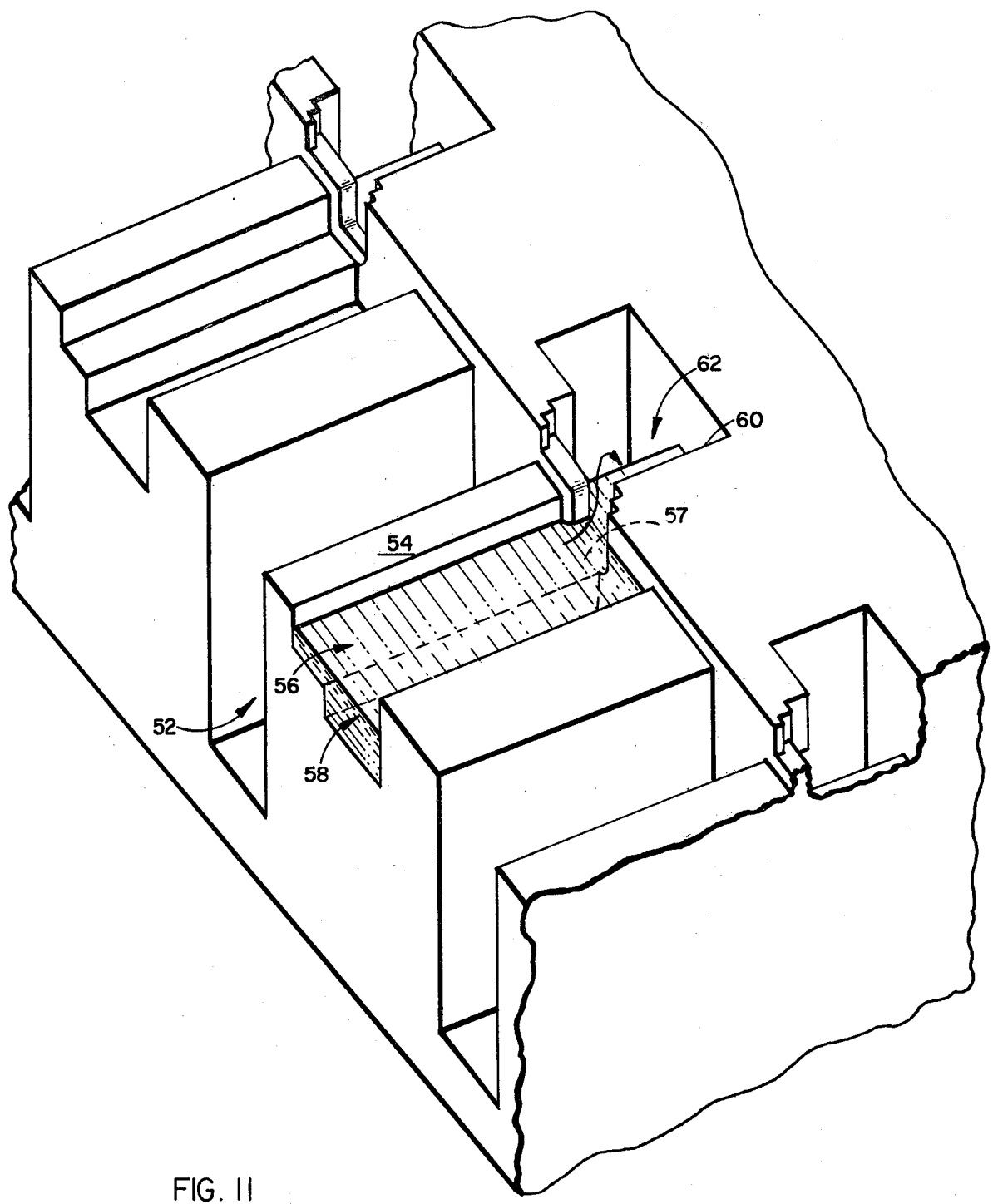
Figure 12:
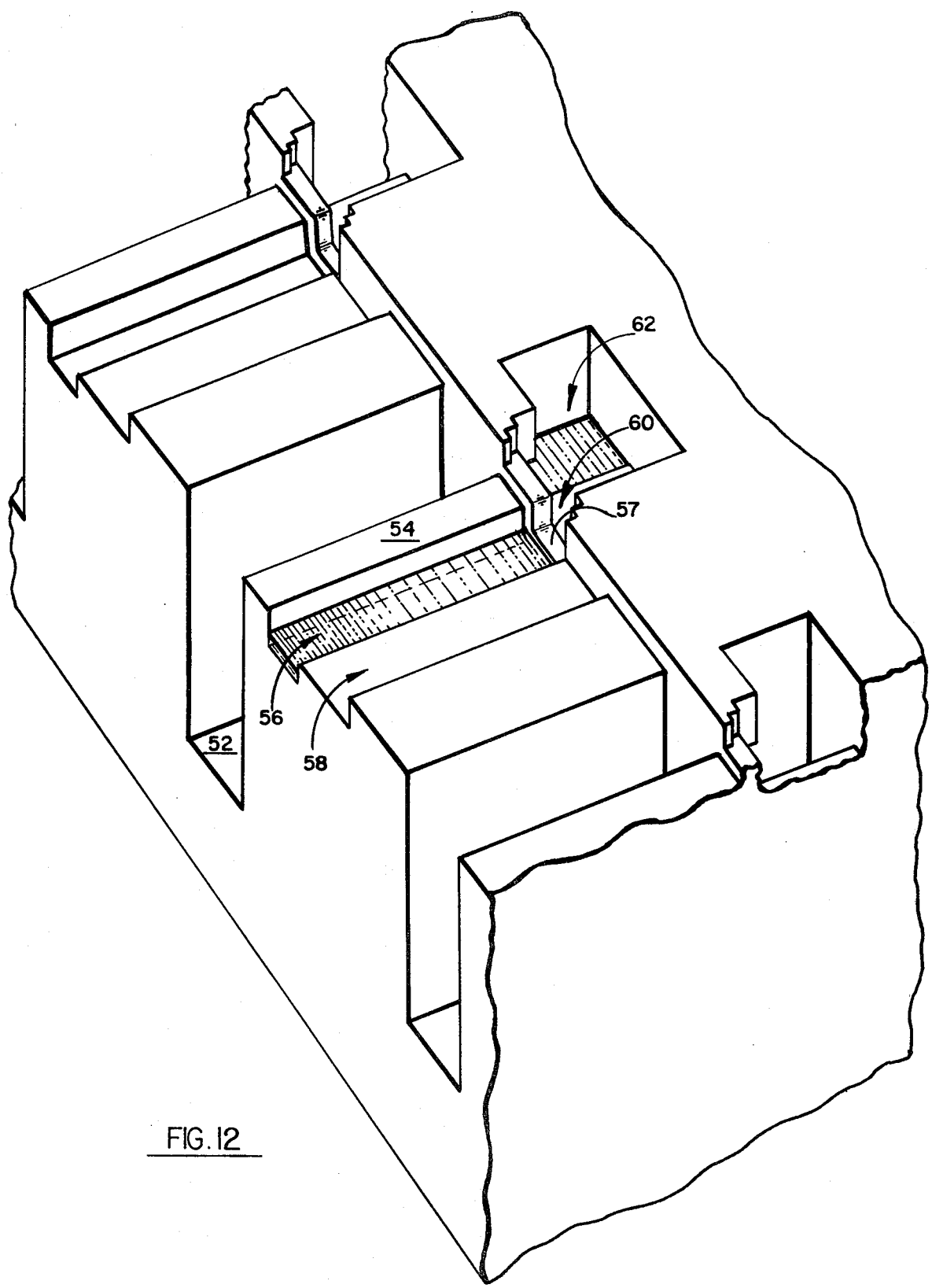

In order to permanently store information in the permanent charge storage structures 26, charge packets representing the information to be stored are propagated through normal CCD operation until the charge packets are stored in potential wells under the phase four electrodes $D_i$ which form a portion of the same period of the drive electrode pattern as the phase two electrode $B_i$ which controls storage in the permanent storage structure 26 into which each packet of charge is to be written. Thereafter, the waveforms applied to the drive electrodes are altered as indicated in FIG. 7 in the time period $t_1 - t_6$ in order to shift the charge packets backward along the charge propagation channel. Such backward movement of the charge packets causes the charge packets to move sidewise into the charge transfer material underlying the permanent storage structures 26 because of the rachet structure of memory device 20. This alteration of the voltage waveforms comprises retaining the $\phi_1$ waveform at its most positive voltage, rather than allowing the $\phi_1$ waveform to drop to its most negative voltage and allowing the $\phi_2$ waveform to rise to its most positive voltage as would occur at time $t_1$ if the waveforms were not altered. The $\phi_4$ waveform is not altered, since it must rise to its most positive voltage in order to force the charge stored under the electrodes $D_i$ to propagate in a backward direction. The $\phi_2$ waveform is modified by forcing it to go to a storage or write voltage which is much more negative than the most negative voltage which is reached by the $\phi_2$ waveform during propagation of charge in the forward direction. The alteration of the $\phi_2$ waveform allows all of the charge in a charge packet to be transferred to a potential well under the permanent charge storage location and causes electric field dependent charge transport between the potential well 62 and the permanent storage interfoil or site 27 when a full packet of charge is transferred to the storage potential well. The area of the storage potential well may be substantially smaller than the area of a potential well within the charge transfer channel. The greater depth of the storage potential well gives it the ability to store substantially more charge per unit area than can be stored by a propagation potential well in the charge transfer channel. The increased quantity of charge stored per unit area of the storage potential well speeds the tunneling process whereby charge is trapped at a permanent storage interface. The potential wells 52 and 58 within the charge transfer channel 30 may preferrably have an area 2 to 4 or more times (depending on the characteristics of the permanent charge storage structures 26) larger than the area of the potential well 62 under the permanent storage structures 26. The potential well pattern at the time $t_1$ is illustrated in a partially cut away cross-sectional perspective view in FIG. 8. In FIGS. 8–12, the lower an area is in the diagram, the deeper is the potential well at that point. The area within which the depth of the potential well is controlled by the electrodes A through D are indicated along the left hand side of this figure. At time $t_2$, after the $\phi_3$ waveform has reached its large negative "storage" or "write" voltage, the potential well pattern appears as in FIG. 9. The potential wells 52 and 62 are made very deep by the large negative voltage applied to the electrodes $B_i$. At time $t_3$ after the voltage $\phi_4$ has risen part way toward its most positive level, the potential well pattern appears as illustrated in FIG. 10. At this time, the charge packet within potential well 58 has spread into potential well 56 because of the decreased storage capacity of well 58 which results from the decreased depth of the well 58. At time $t_4$, when the voltage $\phi_4$ has risen to a voltage nearer its most positive voltage, potential well pattern appears as illustrated in FIG. 11. At time $t_4$, the storage capacity of potential well 58 has been reduced sufficiently that charge packet therein not only spreads in to well 56, but flows over the barrier of well 57 into well 60 and thence into well 62. At time $t_5$ after the $\phi_4$ voltage waveform has reached its most positive value, the potential well pattern appears as is illustrated in FIG. 12. The deep potential well 62 creates conditions favorable for tunneling (or other electric field dependent transport of charge) in the presence of significant quantities of charge in the potential well 62. Since the quantity of charge which successfully tunnels to the storage interface depends on (1) the quantity of charge in the potential well, (2) the potential applied to the potential well and (3) the amount of time available for tunneling, the quantity of time during which the deep potential well is maintained under the $\phi_2$ electrode will depend on the operational characteristics of the device and the quantity of charge which is to be trapped at the storage interface when a full packet of charge is being stored. After sufficient time has elapsed to allow tunneling of the desired quantity of charge from a full charge packet, the $\phi_2$ voltage on the electrode $B_i$ is returned to its most positive value at $t_6$ to force recombination of any charge remaining in potential well 62. The propagation sequence of voltages may be reapplied to the structure as at $t_7$, if it is desired to shift more data into the charge storage structure.

Information stored in the permanent charge storage structures is preferably read in the following manner. First, full packets of charge are transported to the potential wells 58 underlying the $\phi_4$ electrodes $D_i$. This may be accomplished in any convenient manner. If desired, individual charge packets may be inserted and transported along the charge transfer channel 30 in the same manner as data charge packets are transferred. In the alternative, potential well inducing voltages can be applied to all of the control electrodes and a flood of charge may be introduced into the charge transfer channel 30. Under these circumstances, the flood of charge will spread throughout the channel filling the potential well under the electrodes $D_i$ as well as other potential wells. Thereupon, the potential applied to the $\phi_1$, $\phi_2$ and $\phi_3$ electrodes ($A_i$, $B_i$ and $C_i$, respectively) is reduced to eliminate the inversion regions thereunder. The elimination of the inversion regions forces the charge in the potential wells underlying these electrodes to recombine in the bulk material. Thereafter, the charge packets stored in the potential wells 58 underlying the electrodes $D_i$ are transferred in the backwards direction and sidewise into the potential wells 62 underlying the permanent charge storage structure 26. This is accomplished in the same manner as discussed previously with respect to writing charge into the permanent charge storage structures, with the exception that the potential well underlying the charge storage structure is not made deep enough to induce significant tunneling. Once the charge packets are localized in the potential wells 62 underlying the permanent charge storage structures, the potential applied the $\phi_2$ electrodes $B_i$ is reduced to a level which causes an inversion region under the permanent charge storage structure and electrode $B_i$ to just be eliminated if a full packet of charge was stored in the permanent charge storage structure in which no charge is permanently stored remains in the potential well. At those storage sites which store a significant charge, the electric field engendered by the potential applied to the overlying electrodes $B_i$ terminates on charges stored in the permanent charge storage structure. Consequently, the inversion region thereunder is eliminated and the charge packet in the potential well underlying the storage site is eliminated by recombination in the bulk material. Once the information stored in the permanent charge storage site has been converted to charge packets in the potential well thereunder by the above-described process, these charge packets are transported into the main charge transfer channel 30 by applying a normal set of propagation voltages to the propagation electrodes. However, the propagation voltage pattern must begin with a potential well underlying the $\phi_2$ electrodes $B_i$ in order to maintain the potential wells and the charge packets therein.

As a consequence of this matter of reading information from the permanent charge storage sites, the information transported along the channel will be inverse of the information which was transported along the channel in writing the information into the storage sites. That is, a storage site which is charged had a charge packet thereunder during, writing, but upon being read a storage site which is charged eliminates the charge packet thereunder. The charge storage in this device may be analog, to the extent of the ability of the system to store partial packets of charge and its ability to distinguish the size of the partial packet during readout.

Prior to reducing in depth the potential well underlying the $\phi_2$ electrode $B_i$, a propagation storage potential is induced in the potential wells under the electrodes $D_i$ and a transport potential is applied to the electrodes $C_i$ which provides a potential well thereunder which is deep enough to allow charge to flow thereover without being forced to recombine in bulk. As the voltage applied to the electrodes $B_i$ increases toward its most positive value, the depth of the potential well under the charge storage structure 26 is reduced. This forces the charge therein to flow over the potential wells 57 and 56 underlying the electrodes $C_i$. Upon traversing the potential well 56, the charge is attracted into the deeper potential well 58 underlying the electrodes $D_i$. When the voltage waveform $\phi_2$ applied to the electrodes $B_i$ reaches its most positive value, all the charge which was stored in a potential well 62 underlying the permanent charge storage structure has been transferred to the potential well 58 underlying the electrodes $D_i$, except for a small quantity of charge in the potential well 60 which is prevented from traversing the barrier 57 created by the ridge 38. However, the loss of this charge is not important during read-out because smaller quantities of charge can be effectively distinguished during readout than can be distinguished during writing into the permanent charge storage structures because during readout there is no need to induce electric field dependent charge transport across an insulator.

Information stored at the permanent charge storage sites may be erased by applying an erase voltage to the electrodes $B_i$. This erase voltage is of high magnitude and of opposite polarity to the write voltage. The erase voltage induces field dependent charge transport (tunneling) between the storage interface and the charge transport material in a direction to eliminate the charge trapped at the interface.

Thus, there has been shown and described a preferred embodiment of the instant invention. This embodiment is not intended to be limitative, but is illustrative only. Those skilled in the art may be able to modify the embodiment described. For example, the spacing of the propagation electrodes from the charge transfer material may be varied. Other modifications in the device configuration may be made, as may changes in the propagation signals. Nevertheless, any modifications falling within the purview of the description are intended to be included within the scope of this invention which is limited only by the claims appended thereto.

I claim:

1. A permanent storage charge transfer memory comprising:
    a material capable of supporting charge transfer action;
    insulation means overlying said material;
    charge transfer channel defining means for limiting the lateral extent of a charge transfer channel within said material;
    a set of overlying charge propagation electrodes spaced from said material by said insulation, said overlying propagation electrodes being configured to create a preferred direction of propagation within said charge transfer channel;
    permanent charge storage means for permanently storing charge, said means being displaced laterally from said charge transfer channel;
    said permanent charge storage means overlying a portion of the charge transfer material and said charge transfer channel defining means providing an uninterrupted connection between said material underlying the permanent charge storage sites and a material comprising the charge transfer channel;
    barrier inducing means disposed to create a barrier to charge transport between said charge transfer channel and said transfer material underlying said permanent charge storage means, said barrier being sufficiently high to prevent charge from spreading into the charge transfer material underlying the permanent storage site during propagation of charge within the propagation channel in the preferred direction of propagation and low enough to allow charge to spread from the charge propagation channel to the portion of the charge transfer material underlying said permanent charge storage means during propagation of charge within the charge transfer channel in a direction opposed to the preferred direction of propagation;
    ratchet means for forcing charge propagated in the nonpreferred direction in the charge transfer channel to cross the barrier into the charge transfer channel to cross the barrier into the charge transfer material underlying said permanent charge storage means.

2. The device recited in claim 1 wherein said barrier means is associated with said means for inducing a preferred direction of charge propagation.

3. The device recited in claim 2 wherein said set of charge propagation electrodes comprise a plurality of periods of electrodes, the first electrode of each period being connected to each other first electrode, the second electrode of each period being connected to each other second electrode and so forth; and wherein one electrode of each period controls the potential within a portion of charge transfer channel underlying that period of electrodes and also controls the potential at the permanent charge storage means and another electrode from each period controls the potential within another portion of the charge transfer channel underlying that period of electrodes and also controls the potential within at least a portion of the region of continuous charge transfer material which connects the charge transfer material of the channel to the charge transfer material underlying said permanent storage means.

4. In a permanent charge-storage charge-transfer memory in which charge packets are introduced into the memory by insertion into a charge transfer channel; in which charge packets are propagated along said channel, under the influence of a set of propagation electrodes overlying said channel, until said charge packets located where they are to be permanently stored; and in which the charge packets are permanently stored through electric field dependent transport between the charge transfer material and a permanent storage structure capable of trapping charge thereat, the improvement comprising:
    disposing the permanent storage structures in locations laterally displaced from the charge transfer channel to minimize permanent-storage-structure-induced charge transfer inefficiencies in the propagation channel;
    means for preventing charge propagated in a forward direction along the channel from spreading into the portion of the charge transfer material underlying the permanent storage structure; and
    means for forcing charge propagated in a backward direction along said charge transfer channel to flow into the portion of the charge transfer material underlying the permanent storage structure.

5. The permanent charge-storage charge-transfer memory recited in claim 4 wherein said means for preventing comprises:

channel stop means defining the edge of the charge transfer channel except within a transition region between the charge transfer channel and the charge transfer material underlying the permanent storage structure; and means for reducing the depth of a potential well induced in said transition region by the portion of an electrode overlying said transition region whereby the potential well in the transition region is shallower than the potential well in the adjacent portion of the charge transfer channel.

6. The permanent charge-storage charge-transfer memory recited in claim 5 wherein said set of propagation electrodes are spaced from the underlying charge transfer material by a layer of electrically insulating material and wherein said means for reducing the depth of a potential well comprises:

a ridge in said electrically insulating material spacing said overlying electrode from the charge transfer material, said ridge spacing the portion of the electrode overlying the transition region sufficiently further from the charge transfer material than the spacing of the portion of the electrode overlying the charge transfer channel to reduce the depth of the potential well within the transition region sufficiently from the depth of the potential well in the adjacent portion of the charge transfer channel to restrict charge propagating in a forward direction within the charge transfer channel to remain within the charge transfer channel.

7. The permanent charge-storage charge-transfer memory recited in claim 5 wherein said means for forcing comprises:

means for reducing the depth of a potential well across the width of the charge transfer channel and within a longitudinal portion of the charge transfer channel to a point where the reduced depth of the potential well within the charge transfer channel is a greater hindrance to backward charge propagation than the barrier created by the reduced-depth potential well within the transition region whereby charge propagated in said backwards direction is forced to propagate through the transition region into the charge transfer material underlying said permanent storage structure.

8. The permanent charge-storage charge-transfer memory recited in claim 7 wherein said means for reducing the potential well within the charge transfer channel comprises:

a step in the thickness of the electrically insulating material, a riser of said step running substantially perpendicular to the forward direction of charge transfer within the charge transfer channel, said step oriented so that it is step down closer to the underlying charge transfer material when traversed in a direction of forward charge propagation in the charge transfer channel, said step being of sufficient height so that when propagation voltages are applied to said set of propagation electrodes, the potential well underlying the lower step is deeper than the potential well within the transition region and such that the potential well underlying the upper step is shallower than the potential well underlying the transition region.

9. The permanent charge-storage charge-transfer memory recited in claim 8 wherein a single electrode is disposed over said riser of said step, as well as at least a portion of the upper level of said step and at least a portion of the lower level of said step.

* * * * *